(12) United States Patent
Ishida et al.

(10) Patent No.: US 6,472,283 B1
(45) Date of Patent: Oct. 29, 2002

(54) MOS TRANSISTOR PROCESSING UTILIZING UV-NITRIDE REMOVABLE SPACER AND HF ETCH

(75) Inventors: Emi Ishida, Sunnyvale, CA (US); Srinath Krishman, Campbell, CA (US); Ming Yin Hao, Sunnyvale, CA (US); Effiong Ibok, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/667,787

(22) Filed: Sep. 22, 2000

Related U.S. Application Data

(60) Provisional application No. 60/155,550, filed on Sep. 24, 1999.

(51) Int. Cl.[7] .............................................. H01L 21/336
(52) U.S. Cl. ...................... 438/305; 438/303; 438/306; 438/527; 438/230; 438/231
(58) Field of Search ................................. 438/305, 306, 438/303, 696, 527, 230, 231

(56) References Cited

U.S. PATENT DOCUMENTS

| | | | |
|---|---|---|---|
| 4,722,909 A | 2/1988 | Parrillo et al. | |
| 4,745,086 A | 5/1988 | Parrillo et al. | |
| 4,981,810 A | * 1/1991 | Fazan et al. | 438/305 |
| 5,153,145 A | * 10/1992 | Lee et al. | 438/305 |
| 5,700,580 A | 12/1997 | Becker et al. | |
| 5,756,216 A | 5/1998 | Becker et al. | |
| 5,766,991 A | 6/1998 | Chen | |
| 6,300,205 B1 | * 10/2001 | Fulford et al. | 438/303 |

* cited by examiner

Primary Examiner—Carl Whitehead, Jr.
Assistant Examiner—Christy Novacek

(57) ABSTRACT

Submicron-dimensioned MOS and/or CMOS transistors are fabricated by a process employing removable sidewall spacers made of a material, such as UV-nitride, which is readily etched in its as-deposited, undensified state but difficult-to-etch in its thermally annealed, densified state. The as-deposited, undensified spacers are removed by etching with dilute aqueous HF after implantation of moderately or heavily-doped source/drain regions but prior to annealing of the implants for dopant diffusion/activation and lattice damage relaxation. Lightly- or moderately doped, shallow-depth source/drain extensions are implanted and annealed after spacer removal.

19 Claims, 2 Drawing Sheets

MOS TRANSISTOR PROCESSING UTILIZING UV-NITRIDE REMOVABLE SPACER AND HF ETCH

RELATED APPLICATIONS

This application claims priority from Provisional Application Serial No. 60/155,550 filed on Sep. 24, 1999 entitled: "MOS TRANSISTOR PROCESSING UTILIZING UV-NITRIDE REMOVABLE SPACER AND HF ETCH", the entire disclosure of which is hereby incorporated by reference herein.

FIELD OF THE INVENTION

The present invention relates to a method of manufacturing MOS-type transistor devices and semiconductor integrated circuits with improved processing methodology resulting in increased reliability and quality, increased manufacturing throughput, and reduced fabrication cost. The present invention is also useful in the manufacture of CMOS semiconductor devices and has particular applicability in fabricating high-density integration semiconductor devices with design features below about 0.18 μm, e.g., about 0.15 μm.

BACKGROUND OF THE INVENTION

The escalating requirements for high density and performance associated with ultra large-scale integration (ULSI) semiconductor devices requires design features of 0.18 μm and below, such as 0.15 μm and below, increased transistor and circuit speeds, high reliability, and increased manufacturing throughput for economic competitiveness. The reduction of design features to 0.18 μm and below challenges the limitations of conventional semiconductor manufacturing techniques.

As feature sizes of MOS and CMOS devices have decreased to the sub-micron range, so-called "short-channel" effects have arisen which tend to limit device performance. For n-channel MOS transistors, the major limitation encountered is caused by hot-electron-induced instabilities. This problem occurs due to high electrical fields between the source and the drain, particularly near the drain, such that charge carriers, either electrons or holes, are injected into the gate or semiconductor substrate. Injection of hot carriers into the gate can cause gate oxide charging and threshold voltage instabilities which accumulate over time and greatly degrade device performance. In order to counter and thus reduce such instabilities, lightly-doped source/drain extension-type transistor structures have been developed, as described below.

For p-channel MOS transistors of short-channel type, the major limitation on performance arises from "punch-through" effects which occur with relatively deep junctions. In such instances, there is a wider subsurface depletion effect and it is easier for the field lines to go from the drain to the source, resulting in the above-mentioned "punch-through" current problems and device shorting. To minimize this effect, relatively shallow junctions are employed in forming p-channel transistors.

The most satisfactory solution to date of hot carrier instability problems of MOS devices is the provision of lightly- or moderately-doped source/drain extensions driven just under the gate region, while the heavily-doped drain region is laterally displaced away from the gate by use of a sidewall spacer on the gate. Such structures are particularly advantageous because they do not have problems with large lateral diffusion and the channel length can be set precisely.

Several processing sequences or schemes have been developed for the manufacture of source/drain extension-type MOS and CMOS transistors for use in high-density integration applications, with a primary goal of simplifying the manufacturing process by reducing and/or minimizing the number of processing steps. Conventional processing schemes for making such MOS transistors generally employ disposable spacers made of various materials, e.g., polysilicon, silicon oxides, silicon nitrides, silicon oxynitrides, and combinations thereof.

According to one conventional process scheme, a precursor structure comprising a semiconductor substrate of one conductivity type having a layer stack comprising a thin gate oxide layer and an overlying gate electrode formed on a portion of a surface thereof is subjected to ion implantation prior to sidewall spacer formation for forming lightly- or moderately-doped implants therein. Following post-implantation annealing, sidewall spacers are formed on the pair of opposing side surfaces of the layer stack by first depositing a dielectric spacer material layer over the substrate surfaces and then removing same from the horizontal regions, i.e., the top surface of the gate electrode layer, and the source and drain regions, by anisotropically etching. Such processing results in sidewall spacers left on the gate layer stack side surfaces that have an approximately quarter-circular cross-section. The dielectric sidewall spacers typically remain through the balance of junction formation processing. After sidewall spacer formation, a heavy source/drain implantation is performed, with the gate layer stack and associated sidewall spacers acting as implantation masking materials. As a consequence of the separate implantations, the heavily-doped source/drain regions are laterally displaced from the gate edges by the thickness of the sidewall spacer material and the lightly- or moderately-doped regions beneath the sidewall spacers act as source/drain extensions.

According to another conventional process scheme, which scheme employs disposable (i.e., removable) sidewall spacers, a precursor structure as described above and comprising a semiconductor substrate of one conductivity type having a layer stack comprising a thin gate oxide layer and an overlying gate electrode layer formed on a portion of a surface thereof is subjected to dielectric layer deposition and patterning to form sidewall spacer layers on opposing side surfaces of the layer stack. Opposite conductivity type p- or n-type dopant impurities are then implanted into the substrate using the layer stack with sidewall spacers formed thereon as an implantation mask, to thereby form moderately- to heavily-doped implants. High temperature annealing is then performed to thermally activate the implanted dopant by diffusion and reduce lattice damage due to implantation, thereby forming source/drain regions and junctions at a predetermined dopant density and depth below the substrate surface. The effective length of the channel of such transistors is determined by the width of the gate insulator/gate electrode layer stack and the width of the sidewall spacers formed thereon. After activation annealing, the sidewall spacers are removed, as by etching, and a second implantation process for implanting n- or p-type opposite conductivity type dopant impurities is performed using only the gate insulator layer/gate electrode layer stack as an implantation mask, thereby forming shallow-depth, lightly- or moderately-doped implants in the substrate in the spaces between the deeper, more heavily-doped source/drain regions. Following this implantation, a second activation process, e.g., rapid thermal annealing (RTA), is performed for effecting dopant diffusion and relaxation of implantationinduced lattice damage of the implants, to form shallow-depth, lightly- or moderately-doped source/drain extensions extending from respective proximal edges of the heavily-doped source/drain regions to just below the respective proximal edges of the gate insulator layer/gate electrode layer stack.

In a variant of the above-described process, the sidewall spacers are comprised of a layer of a first, or inner dielectric sidewall spacer material and a layer of a second, or outer, dielectric spacer material. According to the process methodology of this variant, only the second, or outer, dielectric sidewall spacer layer is removed subsequent to annealing for forming the moderately- to heavily-doped source/drain regions. The first, or inner, dielectric sidewall spacer layer is retained for protecting the gate insulator/gate electrode layer stack during subsequent processing, e.g., for contact formation.

Both variants employ removable sidewall spacers as part of an implantation mask for defining the channel lengths, and each incurs a drawback in that the materials conventionally used for the sidewall spacers, such as those enumerated above, frequently are difficult and time consuming to remove by standard etching methodologies, particularly when densified as a result of high temperature processing for post-implantation annealing. For example, and as described in U.S. Pat. No. 5,766,991, removal of silicon nitride-based spacer layers can require etching in a hot phosphoric acid ($H_3PO_4$) bath at about 180° C. for approximately 1.5 hours. Such long etching time results in reduced manufacturing throughput and the extended exposure to and concomitant attack by the corrosive reagent at high temperature results in undesired etching and defect formation. Moreover, portions of the workpiece substrate not intended to be etched must be provided with an etch-resistant protective barrier layer, e.g., of silicon oxide, prior to etching. However, the etching resistance of the silicon oxide layer to the hot phosphoric acid may be insufficient, in which case the resistance thereof must be increased prior to etching, e.g., by first annealing it at about 900° C. in an oxygen ambient. Alternatively, resistance to attack by the hot $H_3PO_4$ may be obtained by use of an oxide-polysilicon bilayer. In either case, such requirement for provision of at least one layer for protecting from acid attack disadvantageously adds to processing time, complexity, and fabrication cost. Etching of annealed, densified silicon oxide and/or silicon oxynitride-based sidewall spacer layers is similarly difficult.

Thus a need exists for improved semiconductor manufacturing methodology for fabricating MOS and CMOS transistors which does not suffer from the above-described drawbacks associated with the difficulty in conveniently and rapidly removing densified sidewall spacers according to conventional etching techniques. Moreover, there exists a need for an improved process for fabricating MOS transistor-based devices which is fully compatible with conventional process flow and provides increased manufacturing throughput and product yield.

The present invention fully addresses and solves the above described problems and drawbacks attendant upon conventional processing for forming submicron-dimensioned, MOS and CMOS transistors for use in high-density semiconductor integrated circuit devices, particularly in providing a process utilizing first and second dielectric sidewall spacer layers, the second, or outer, spacers being formed of a dielectric material which is easily and rapidly etched m its as-deposited, undensified state but difficult-to-etch in its annealed, densified state, wherein the undensified second spacers are removed prior to any post-implantation thermal annealing treatment for dopant activation and lattice damage relaxation. The first, or inner, spacers are formed of a dielectric material which is less readily etched than the second, outer spacer layer, whether in its as-deposited, undensified state or its annealed, densified state, and is retained throughout processing for protecting the gate insulator/gate electrode layer stack from attack by corrosive etchant and during subsequent metallization for contact formation.

DISCLOSURE OF THE INVENTION

An advantage of the present invention is an improved method for manufacturing MOS and/or CMOS transistor devices utilizing a removable sidewall spacer.

Another advantage of the present invention is an improved method for manufacturing MOS and/or CMOS transistor devices utilizing a removable sidewall spacer formed of a readily etchable dielectric material.

Another advantage of the present invention is an improved method of manufacturing submicron-dimensioned MOS transistors for use in high-density semiconductor integrated circuit devices at lower cost, higher manufacturing throughput, and increased product yield and reliability than are obtainable with conventional process methodology.

Additional advantages and other features of the present invention will be set forth in the description which follows and in part will become apparent to those having ordinary skill in the art upon examination of the following or may be learned from the practice of the instant invention. The advantages of the present invention may be realized and obtained as particularly pointed out in the appended claims.

According to an aspect of the present invention, the foregoing and other advantages are achieved in part by a method of manufacturing a semiconductor device, which method comprises the sequential steps of:

(a) providing a device precursor structure comprising a semiconductor substrate of a first conductivity type and a layer stack formed on a portion of a surface of the substrate, the layer stack comprising:
  i. a thin gate insulating layer in contact with the substrate surface; and
  ii. a gate electrode layer formed on the gate insulating layer, the layer stack comprising a pair of opposing side surfaces and a top surface;

(b) forming a first pair of insulative, tapered sidewall spacers on each of the pair of opposing side surfaces, the first pair of sidewall spacers comprising a first dielectric material which is relatively etch-resistant in its as-deposited, undensified state;

(c) thermally treating the first pair of sidewall spacers to convert the first dielectric material from its as-deposited, undensified state to its annealed, densified state, thereby increasing the etch resistance of the first pair of sidewall spacers;

(d) forming a second pair of insulative, tapered sidewall spacers on each of the first pair of sidewall spacers, the second insulative spacers comprising a second dielectric material which is readily etched in its as-deposited, undensified state but difficult-to-etch in its thermally treated, densified state;

(e) selectively introducing dopant impurities of a second, opposite conductivity type into exposed portions of the substrate surface adjacent the first and second pairs of sidewall spacers to form a pair of spaced-apart, heavily-doped implants in the substrate;

(f) selectively removing the as-deposited, undensified second pair of sidewall spacers by etching;

(g) thermally treating the pair of spaced-apart, heavily-doped implants to form a pair of heavily-doped source/drain junction regions in the substrate at a predetermined depth below the substrate surface, each of the heavily-doped source/drain junction regions being laterally spaced from a respective proximal edge of the gate insulating layer by a distance substantially equal to the combined width of the lower ends of the first and second pairs of sidewall spacers;

(h) introducing second, opposite conductivity type dopant impurities into exposed portions of the substrate surface intermediate the gate insulating layer and the heavily-doped source/drain regions to form lightly- or moderately-doped source/drain extension implants; and (i) thermally treating the lightly- or moderately-doped source/drain extension implants to form a pair of shallow-depth, lightly- or moderately-doped source/drain extensions in the substrate, each of the shallow-depth, lightly- or moderately-doped source/drain extensions extending from a proximal edge of a respective source/drain junction region to beneath a respective proximal edge of the gate insulating layer.

In embodiments according to the present invention, the method further comprises the step of:

(j) forming a second pair of insulative sidewall spacers over each of the first pair of insulative sidewall spacers, the second pair of insulative sidewall spacers comprising the second dielectric material or a different material.

According to further embodiments of the present invention, step (a) comprises providing a semiconductor substrate of n or p first conductivity type, preferably a silicon wafer substrate, the thin gate insulating layer comprises a silicon oxide layer preferably about 25–50 Å thick, and the gate electrode layer preferably comprises heavily-doped polysilicon; step (b) comprises forming the first pair of insulative sidewall spacers from a first dielectric material selected from silicon oxides, silicon nitrides, and silicon oxynitrides, the first pair of sidewall spacers being formed with a predetermined tapered profile wherein the widths thereof vary from relatively wide at the lower ends in contact with the substrate surface to relatively narrow at the upper ends thereof; step (c) comprises rapid thermal annealing (RTA); step (d) comprises forming the second pair of insulative sidewall spacers from a UV-nitride deposited in a undensified state, the spacers being formed in a predetermined width profile wherein the widths thereof vary from relatively wide at the lower ends in contact with the substrate surface to relatively narrow at the upper ends thereof, step (e) comprises selectively introducing p or n second, opposite conductivity type dopant impurities by ion implantation, preferably by implanting dopant impurities in an amount sufficient to provide heavily-doped, relatively deep source/drain junctions; step (f) comprises selectively removing the as-deposited, undensified UV-nitride sidewall spacers by etching with dilute aqueous HF, preferably 1:100 HF/H$_2$O at a moderate temperature, at a relatively rapid rate; step (g) comprises rapid thermal annealing at a temperature of from about 1,000° C. to about 1,100° C. for from about 10 sec. to about 45 sec. to diffuse and activate the dopant impurities introduced during step (e); step (h) comprises introducing p or n second, opposite conductivity type dopant impurities by ion implantation, preferably by implanting dopant impurities in an amount sufficient to provide lightly- or moderately-doped source/drain. extension regions with a shallow junction depth below the substrate surface; and step (i) comprises rapid thermal annealing at from about 900 to about 1,000° C. for from about 10 sec. to about 45 sec. to diffuse and activate the dopant impurities introduced during step (h).

According to another aspect of the present invention, a method of manufacturing a silicon-based MOS transistor is provided, which method comprises the sequential steps of:

(a) providing a MOS transistor precursor structure comprising a silicon semiconductor wafer substrate of a first conductivity type and a layer stack formed on a portion of a surface of the wafer, the layer stack comprising:
  i. a thin gate insulating layer comprising a silicon oxide layer about 25–50 Å thick in contact with the wafer surface; and
  ii. a gate electrode layer comprising heavily-doped polysilicon formed on the gate insulating layer, the layer stack comprising a pair of opposing side surfaces and a top surface;

(b) forming a first pair of insulative, tapered sidewall spacers on each of the pair of opposing side surfaces, the first pair of sidewall spacers comprising a first dielectric material selected from silicon oxides, silicon nitrides, and silicon oxynitrides, said first dielectric material being relatively etch-resistant in its as-deposited, undensified state;

(c) thermally treating the first pair of sidewall spacers to convert the first dielectric material from its as-deposited, undensified state to its annealed, densified state, thereby increasing the etch resistance of the first pair of sidewall spacers;

(d) forming a second pair of insulative, tapered sidewall spacers on each of the first pair of sidewall spacers, the second insulative spacers comprising a UV-nitride material which is readily etched in its as-deposited, undensified state but difficult-to-etch in its annealed, densified state;

(e) selectively implanting dopant impurities of a second, opposite conductivity type into exposed portions of the wafer surface adjacent the first and second pairs of sidewall spacers to form a pair of spaced-apart, heavily-doped implants in the wafer;

(f) selectively removing the as-deposited, undensified U -nitride sidewall spacers by etching with dilute aqueous HF, preferably with 1:100 HF/H$_2$O at a moderate temperature;

(g) performing rapid thermal annealing to diffuse and activate the dopant impurities implanted in step (e), thereby forming a pair of heavily-doped, relatively deep, source/drain junction regions in the wafer, each of the heavily-doped source/drain junction regions being laterally spaced from a respective proximal edge of the gate insulating layer by a distance substantially equal to the combined width of the lower ends of the first and second pairs of sidewall spacers;

(h) selectively implanting second, opposite conductivity type dopant impurities into exposed portions of the wafer surface intermediate the gate insulating layer and the heavily-doped source/drain junction regions to form lightly- or moderately-doped source/drain extension implants therein; and (i) performing thermal annealing to diffuse and activate the dopant impurities implanted during step (h), thereby forming a pair of shallow-depth, lightly- or moderately-doped source/drain extension regions in the wafer, each of the shallow-depth, lightly- or moderately-doped source/drain extensions extending from a proximal edge of a respective source/drain junction region to beneath a respective proximal edge of the gate insulating layer.

In embodiments according to the present invention, the method further comprises the step of:

(i) forming a second pair of insulative sidewall spacers of predetermined width over each of the first pair of insulative sidewall spacers, the second pair of spacers comprising the UV-nitride dielectric material or a different dielectric material.

According to yet another aspect of the present invention, silicon-based MOS transistor devices formed by the method of the above-enumerated steps (a)–(h) are provided.

Additional advantages and aspects of the present invention will become readily apparent to those skilled in the art from the following detailed description, wherein only the preferred embodiment of the present invention is shown and described, simply by way of illustration of the best mode contemplated for carrying out the method of the present invention. As will be described, the present invention is capable of other and different embodiments, and its several details are susceptible of modification in various obvious respects, all without departing from the spirit of the present invention. Accordingly, the drawing and description are to be regarded as illustrative in nature, and not as limitative.

DESCRIPTION OF THE INVENTION

The present invention addresses and solves problems arising from manufacturing submicron-dimensioned, MOS and CMOS transistors suitable for use in high-density integration semiconductor devices, wherein, as part of the fabrication methodology, sidewall spacers which act as at least part of an implantation mask during the formation of moderately to heavily-doped source/drain regions are removed, as by etching, prior to implantation for forming lightly- or moderately-doped source/drain extensions. More specifically, the present invention advantageously provides a significant and substantial reduction in the duration and corrosive severity of the requisite anisotropic etching step for selectively removing the second, or outer sidewall spacers, thereby increasing device reliability and manufacturing throughput, while decreasing fabrication cost and product yield problems associated with the conventional technology. In addition, the inventive method is fully compatible with other aspects of existing processing methodology.

According to the present invention, a method of manufacturing MOS and CMOS transistors is provided which utilizes first and second dielectric material sidewall spacer layers, the second, or outer, sidewall spacer layer comprising a dielectric material which is easily and rapidly etched in its as-deposited, undensified state but difficult-to-etch in its annealed, densified state, and the first, or inner, sidewall spacer layer being comprised of a dielectric material which is less easily etched than the second, outer spacer layer in its as-deposited, undensified state an even less easily etched in its annealed, densified state. The second, outer spacer layer is substantially wider than the first, inner spacer layer and provides the bulk of the masking function during ion implantation for forming moderately to heavily-doped source/drain regions spaced a predetermined distance from respective proximal edges of the gate insulator/gate electrode layer stack. The as-deposited, undensified second sidewall spacers are readily removed by etching prior to any post-implantation thermal annealing treatment for dopant activation and lattice damage relaxation, whereas the thinner first, or inner, sidewall spacers which have been densified by annealing and thus rendered extremely etch-resistant, are retained throughout processing for protecting the layer stack from attack by corrosive etchant and during metallization processing for contact formation.

Figure 1A:
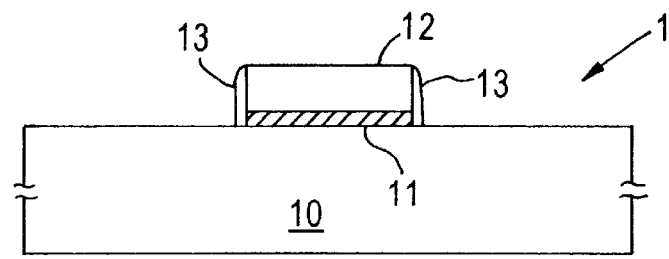
FIGS. 1(A)–1(I) illustrate, in simplified, cross-sectional form, a sequence of processing steps for forming an MOS transistor according to an embodiment of the present invention.

Referring now to FIGS. 1(A)–1(I), shown therein is a sequence of steps for performing an illustrative, but not limitative, MOS-based embodiment of the present invention, wherein similar reference numerals denote similar features. As will be apparent to one of ordinary skill in the art, the inventive process may be readily adapted for use in the manufacture of CMOS transistors and similar devices. Referring more particularly to FIG. 1(A), in a first step, a MOS device precursor 1, fabricated according to conventional techniques not described herein in order not to unnecessarily obscure the present invention, is provided, comprising a doped monocrystalline silicon (Si) substrate 10 of first conductivity type (p or n), with a thin gate dielectric layer 11, typically of a silicon oxide about 25–50 Å thick, formed on a portion of the substrate surface destined to overlie the channel region of the transistor. Contiguous and forming a layer stack with the gate dielectric layer 11 is a thicker gate electrode layer 12, typically of heavily-doped polysilicon, for providing electrical contact to the gate or channel region. First, or inner, insulative sidewall spacer layers 13 of a dielectric material, preferably a silicon oxide, a silicon nitride, or a silicon oxynitride, are formed in conventional manner (as by blanket deposition or thermal growth of a silicon oxide layer over the entire substrate surface, followed by selective anisotropic etching of the horizontally aligned surfaces thereof), on each of the opposing side surfaces of the gate insulator/gate electrode layer stack 11/12. Sidewall spacer layers 13 are each formed with a predetermined tapered width profile, the widths thereof varying from relatively wide at the lower ends thereof in contact with the surface of substrate 10 to relatively narrow at the upper ends thereof. Notwithstanding the greater resistance of the as-deposited, undensified silicon oxide first sidewall spacers 13 to etching with dilute aqueous HF vis-a-vis as-deposited, undensified UV-nitride second spacer layers (deposited in a later step), the silicon oxide-based first sidewall spacers are subjected to densification treatment for further increase of their etching resistance to dilute aqueous HF, e.g., rapid thermal annealing (RTA).

Figure 1B:
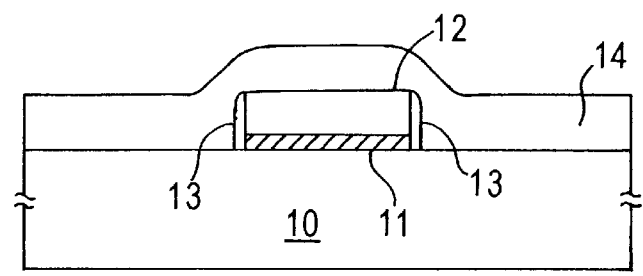

Referring now to FIG. 1(B), a layer 14 of UV-nitride is blanket-deposited over the surface of the dielectric gate oxide 11/gate electrode 12 layer stack. The UV-nitride layers 14 are undensified as-deposited and readily etchable with dilute aqueous HF, e.g., with 1:100 HF/H$_2$O, at moderate temperatures, whereas densified UV-nitride layers, such as are obtained subsequent to annealing treatment at elevated temperatures, are difficult-to-etch under essentially equivalent conditions. In addition, etching rates of either as-deposited, undensified or annealed, densified silicon oxides under comparable conditions are considerably slower.

Figure 1C:
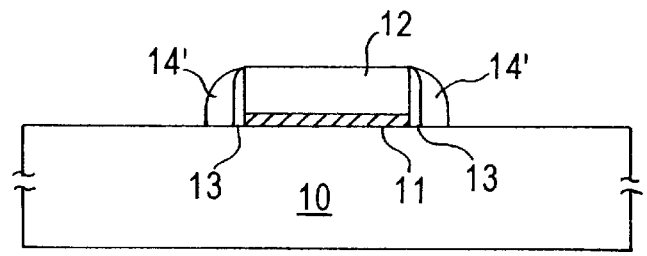

FIG. 1(C) shows the result of anisotropic etching of the horizontally oriented surfaces of the as-deposited, undensified UV-nitride layer 14 using dilute aqueous HF according to the conditions described supra. Selective removal of the horizontally oriented portions of the UV-nitride layer overlying the substrate 10 surface and the upper surface of the gate electrode layer 12 results in the formation of roughly quarter circle-shaped second, or outer, sidewall spacers 14' in contact with the outer surfaces of the first insulative sidewall spacers 13. The relatively wide second sidewall spacers 14' have a tapered width profile in cross-section varying from relatively wide at the lower ends thereof in contact with the surface of substrate 10 to relatively narrow at their upper ends. Inasmuch as the relatively wide second sidewall spacers 14' provide the bulk of the masking function during subsequent dopant ion implantation, the conditions for the selective anisotropic etching of the as-deposited, undensified UV-nitride layer are selected so as to yield a desired width of the sidewall spacers 14' at their lower ends, which width is selected for optimization of the subsequently formed lightly- or moderately-doped source/drain extension regions of the transistor.

Figure 1D:
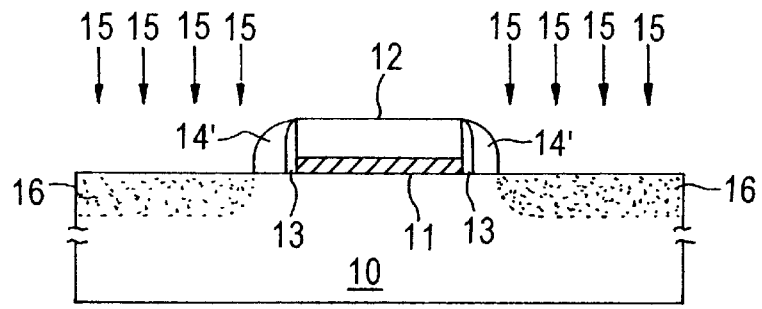

Adverting to FIG. 1(D), following formation of sidewall spacers 14' of predetermined width profile, dopant-containing ions 15 of second conductivity type opposite that of substrate 10 are implanted, with layer stack 11/12 and associated sidewall spacers 14' acting as implantation masks, to form moderately to heavily-doped source/drain regions 16. Dopant ion implantation is performed at a dosage and energy selected for optimal transistor performance. For example, by way of illustration but not limitation, for a p-type Si substrate intended to comprise an n-channel transistor, n-type dopant impurities 15 (typically chosen from phosphorus (P), arsenic (As), and antimony (Sb)) are implanted at a dosage of about $5 \times 10^{14}$ atoms/cm$^2$ to about $5 \times 10^{15}$ atoms/cm$^2$ at an energy of from about 40 KeV to about 60 KeV. Conversely, for an n-type Si substrate intended to comprise a p-channel transistor, p-type dopant impurities 15 (typically boron) are implanted at similar dosages but at lower energies of from about 20 KeV to about 40 KeV.

Figure 1E:
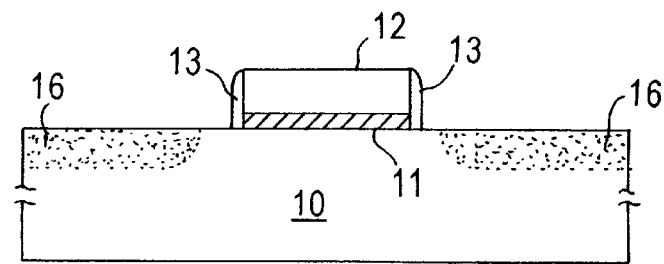

With reference to FIG. 1(E), and according to an essential feature of the present invention, in the following step the as-deposited, undensified sidewall spacers 14' are removed by etching with dilute aqueous HF. Inasmuch as the spacer removal is prior rather than subsequent to high temperature annealing treatment for diffusing the implanted dopant and relaxing lattice damage/stresses resulting from implantation, which thermal treatment densifies and renders the UV-nitride difficult-to-etch, etching is readily performed in a manner similar to that previously utilized for forming the spacers 14' from blanket layer 13. Such etching typically comprises treating with dilute, aqueous HF at moderate temperatures, e.g., 1:100 HF/H$_2$O, for an interval sufficient to remove the sidewall spacers, at removal rates similar to those indicated supra. As compared with the about 1.5 hour interval required for etching of silicon nitride sidewall spacers with hot H$_3$PO$_4$ at 180° C. according to the prior art, the process of the instant invention provides a substantial and significant reduction in the requisite etching duration and severity of etching conditions, thereby simultaneously increasing manufacturing throughput and reducing corrosive attack and resultant damage to the workpiece. As illustrated, the densified, etch-resistant, first sidewall spacers 13 are substantially unaffected by the aforesaid etching process and remain in place throughout subsequent device fabrication processing.

Figure 1F:
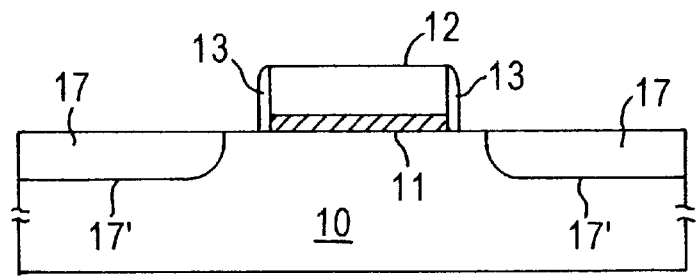

Referring now to FIG. 1(F), following removal of sidewall spacers 14', the thus-formed transistor precursor is treated, as by rapid-thermal annealing (RTA), for effecting diffusion and activation of the implanted dopant ions and lattice damage relaxation so as to form source/drain regions 17 having a predetermined junction 17' depth below the substrate 10 surface. In the case of moderately to heavily-doped n-type source/drain regions 17, RTA is conducted at a temperature of from about 1,000 to about 1,100° C., typically about 1,050° C., for from about 10 to about 45 seconds, typically about 30 seconds, to activate and diffuse the dopant and reduce/relax lattice damage/distortion resulting from the implantation process. In the case of moderately to heavily-doped p-type source/drain regions 17, RTA is performed at a temperature of from about 900 to about 1,000° C., typically about 1,000° C., for from about 10 to about 45 seconds, typically about 30 seconds, for effecting dopant activation, diffusion, and lattice damage relaxation.

Figure 1G:
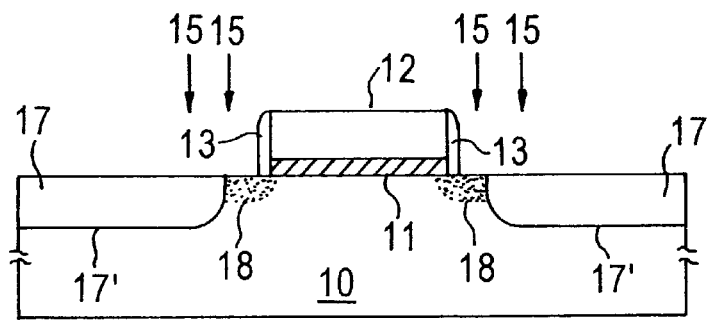

Referring now to FIG. 1(G), in the next step according to the inventive method, dopant-containing ions 15 of opposite, second conductivity type to that of the semiconductor substrate 10 are implanted to form lightly- or moderately-doped source/drain extension implants 18 in the spaces between the moderately to heavily-doped source/drain junction regions 17 and just underlying the respective proximal edges of gate insulator/gate electrode layer stack 11/12. Implantation is performed at lower dosages and energies than previously employed for forming source/drain junction regions 17. In the case of n-type dopant impurities 15, implantation is performed at a dosage of from about $5 \times 10^{13}$ to about $5 \times 10^{14}$ atoms/cm$^2$ and at an energy of from about 10 KeV to about 30 KeV. In the case of p-type dopant impurities 15, implantation is performed at a similar dosage but at a lower energy of from about 5 KeV to about 10 KeV.

Figure 1H:
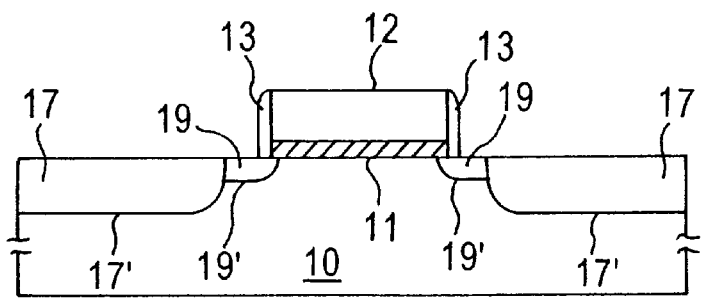

With reference to FIG. 1(H), the thus-implanted structure is then subjected to a thermal treatment, typically RTA, for activating/diffusing the implanted dopant impurities 15 in the lightly- or moderately-doped source/drain extension implants 18 and for relaxation of lattice damage/stress resulting from the implantation process.

Figure 1I:
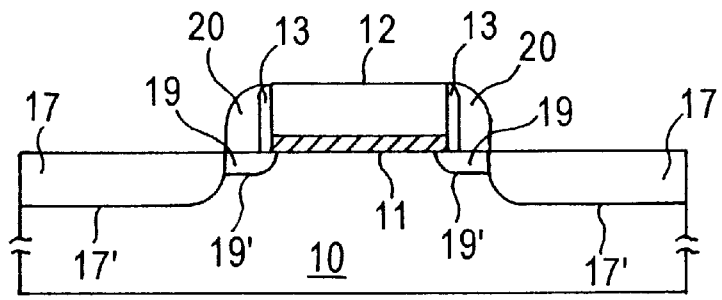

As shown in FIG. 1(I), second, or outer, insulative sidewall spacers 20 are then re-formed over the first, or inner, sidewall spacers 13, as by conventional techniques not described herein for brevity, along the opposing side surfaces of the gate insulator layer/gate electrode layer stack 11/12, for protecting the layer stack and source/drain extensions 19 during subsequent processing, e.g., contact formation and metallization processing. The second sidewall spacers 20 may comprise one or more dielectric material layers selected from polysilicon, silicon oxides, silicon nitrides, silicon oxynitrides, and UV-nitrides.

The present invention thus enables formation of reliable, defect-free submicron-dimensioned MOS transistors at increased rates of manufacturing throughput, by utilizing a readily etchable material for the second, relatively wide dielectric sidewall spacers, which material provides a very significant reduction in the time necessary for etching processing. In addition, the etching is performed under milder conditions, vis-à-vis the hot phosphoric acid etching processing according to the prior art, whereby deleterious effects due to long periods of contact with hot etchant are reduced or eliminated.

The present invention is applicable to the formation of various types of submicron-dimensioned transistors, including CMOS transistors as well as MOS transistors, and is fully compatible with conventional process flow for automated manufacture of high-density integration semiconductor devices.

In the previous description, numerous specific details are set forth, such as specific materials, structures, reactants, processes, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is susceptible of changes or modifications within the scope of the inventive concept as expressed herein.

What is claimed is:

1. A method of manufacturing a semiconductor device, which method comprises the sequential steps of:
   (a) providing a device precursor structure comprising a semiconductor substrate of a first conductivity type and a layer stack formed on a portion of a surface of said substrate, said layer stack comprising:
      i. a thin gate insulating layer in contact with said substrate surface; and
      ii. a gate electrode layer formed on said gate insulating layer, said layer stack comprising a pair of opposing side surfaces and a top surface;
   (b) forming a first pair of insulative, tapered sidewall spacers on each of said pair of opposing side surfaces, said first pair of sidewall spacers comprising a first dielectric material in an as-deposited, undensified state, the first pair of sidewall spacers having lower ends on the surfaces of the substrate;
   (c) thermally treating said first pair of sidewall spacers to convert said first dielectric material from its as-deposited, undensified state to an annealed, densified state;
   (d) forming a second pair of insulative, tapered sidewall spacers on each of said first pair of sidewall spacers, said second sidewall spacers comprising a second dielectric material in an as-deposited, undensified state, the second pair of sidewall spacers having lower ends on the surface of the substrate;
   (e) selectively introducing dopant impurities of a second, opposite conductivity type into exposed portions of said substrate surface adjacent said first and second pairs of sidewall spacers to form a pair of spaced-apart heavily-doped implants in said substrate;
   (f) selectively removing the as-deposited, undensified second pair of sidewall spacers by an etching process;
   (g) thermally treating said pair of spaced-apart, heavily-doped implants to form a pair of heavily-doped source/drain junction regions in said substrate at a predetermined depth below said substrate surface, each of said heavily-doped source/drain junction regions being laterally spaced from a respective proximal edge of said gate insulting layer by a distance substantially equal to the combined width of said lower ends of said first and second pairs of sidewall spacers;
   (h) introducing second, opposite conductivity type dopant impurities into exposed portions of said substrate surface intermediate said gate insulating layer and said heavily-doped source/drain junction regions to form lightly-or moderately doped source/drain extension implants, and
   (i) thermally treating said lightly- or moderately-doped source/drain extension implants to form a pair of shallow-depth, lightly- or moderately-doped source/drain extensions in said substrate, each of said shallow-depth, lightly-doped extensions extending from a proximal edge of a respective source/drain junction region to beneath a respective proximal edge of said gate insulating layer.

2. The method as in claim 1, wherein step (a) comprises providing a silicon wafer substrate of a first conductivity type, said thin gate insulating layer comprises a silicon oxide layer about 25–50 Å thick, and said gate electrode layer comprises heavily-doped polysilicon.

3. The method as in claim 2, wherein step (b) comprises forming said first pair of sidewall spacers from a first dielectric material selected from silicon oxides, silicon nitrides, and silicon oxynitrides.

4. The method as in claim 3, wherein each of said first pair of tapered sidewall spacers has a width varying from relatively wide at the lower end thereof in contact with said substrate surface to relatively narrow at the upper end thereof.

5. The method as in claim 3, wherein step (c) comprises rapid thermal annealing (RTA).

6. The method as in claim 2, wherein step (d) comprises forming said second pair of insulative sidewall spacers from a UV-nitride deposited in an undensified state.

7. The method as in claim 6, wherein each of said second pair of tapered sidewall spacers has a width profile varying from relatively wide at the lower end thereof in contact with said substrate surface to relatively narrow at the upper end thereof.

8. The method as in claim 2, wherein step (e) comprises introducing second, opposite conductivity type dopant impurities by ion implantation.

9. The method as in claim 8, wherein step (e) comprises selectively implanting dopant impurities in an amount sufficient to provide heavily-doped, relatively deep, source/drain junction regions.

10. The method as in claim 9, wherein step (g) comprises rapid thermal annealing to diffuse and activate the dopant impurities introduced during step (e).

11. The method as in claim 6, wherein step (f) comprises selectively removing the as-deposited, undensified UV-nitride sidewall spacers by etching with dilute aqueous HF.

12. The method as in claim 10, wherein step (f) comprises etching the as-deposited, undensified IN-nitride sidewall spacers with 1:100 HF/$H_2O$.

13. The method as in claim 2, wherein step (h) comprises introducing second, opposite conductivity type dopant impurities by ion implantation.

14. The method as in claim 13, wherein step (h) comprises selectively implanting dopant impurities to provide a pair of lightly- or moderately-doped source/drain extension regions.

15. The method as in claim 14, wherein step (i) comprises rapid thermal annealing to diffuse and activate the dopant impurities implanted during step (h).

16. The method as in claim 1, further comprising the step of:
   (j) forming a second pair of insulative, tapered sidewall spacers on each of said first pair of insulative sidewall spacers, the second pair of insulative sidewall spacers comprising said second dielectric material or a different dielectric material.

17. A method of manufacturing a silicon-based MOS-type transistor, which method comprises the sequential steps of:
   (a) providing a MOS transistor precursor structure comprising a silicon semiconductor wafer substrate of a first conductivity type and a layer stack formed on a portion of a surface of said wafer, said layer stack comprising:

i. a thin gate insulating layer comprising a silicon oxide layer about 25–50 Å thick in contact with said wafer surface; and (b) a gate electrode layer comprising heavily-doped polysilicon formed on said gate insulating layer, said layer stack comprising a pair of opposing side surfaces and a top surface;

(c) forming a first pair of insulative, tapered sidewall spacers on each of said pair of opposing side surfaces, said first pair of sidewall spacers comprising a first dielectric material selected from silicon oxides, silicon nitrides, and silicon oxynitrides, said first dielectric material having an as-deposited, undensified state;

(d) thermally treating said pair of sidewall spacers to convert said first dielectric material from its as-deposited, undensified state to an annealed, densified state;

(e) forming a second pair of insulative, tapered sidewall spacers on each of said first pair of sidewall spacers, said second sidewall spacers comprising a UV-nitride material having an as-deposited, undensified state but difficult-to-etch in its thermally treated, densified state;

(f) selectively implanting dopant impurities of a second, opposite conductivity type into exposed portions of said wafer surface adjacent said first and second pairs of sidewall spacers to form a pair of spaced-apart, heavily-doped implants in said wafer;

(g) selectivity removing the as-deposited, undensified UV-nitride second pair of sidewall spacers by etching with dilute aqueous HF;

(h) performing rapid thermal annealing to diffuse and activate the dopant impurities implanted in step (c), thereby forming a pair of heavily-doped, relatively deep, source/drain junction regions in said wafer, each of said heavily doped source/drain junction regions being laterally spaced from a respective proximal edge of said gate insulating layer by a distance substantially equal to the combined width of the lower ends of said first and second pairs of sidewall spacers adjacent said wafer surface;

(i) implanting second, opposite conductivity type dopant impurities into exposed portions of said wafer surface intermediate said gate insulating layer and said heavily-doped source/drain regions to form lightly- or moderately-doped source/drain extension implants therein; and (j) performing thermal annealing to diffuse and activate the dopant impurities implanted in step on), thereby forming a pair of shallow-depth, lightly- or moderately-doped source/drain extension regions in said wafer, each of said shallow-depth, lightly-or moderately-doped source/drain extensions extending from a proximal edge of a respective source/drain region to beneath a respective proximal edge of said gate insulating layer.

18. The method as in claim 17, wherein step (d) comprises forming said insulative sidewall spacers from a UV-nitride deposited in an undensified state; and step (f) comprises etching with 1:100 HF/H$_2$O.

19. The method as in claim 17, further comprising the step of:

(j) forming a second pair of insulative sidewall spacers of predetermined width profile over each of said first pair of insulative sidewall spacers, the second pair of insulative sidewall spacers comprising said UV-nitride dielectric material or a different dielectric material.

* * * * *